(12) United States Patent
Akagawa

(10) Patent No.: US 6,469,371 B2
(45) Date of Patent: Oct. 22, 2002

(54) NON-CONTACT TYPE IC CARD AND PROCESS FOR MANUFACTURING SAME

(75) Inventor: Masatoshi Akagawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/745,707

(22) Filed: Dec. 21, 2000

(65) Prior Publication Data

US 2001/0006118 A1 Jul. 5, 2001

(30) Foreign Application Priority Data

Jan. 5, 2000 (JP) ........................................ 2000-000436

(51) Int. Cl.⁷ .............................................. H01L 23/02
(52) U.S. Cl. ........................ 257/679; 174/260; 361/737; 361/783; 235/492
(58) Field of Search ................................ 174/260, 261, 174/257; 361/737, 783, 782; 257/679; 235/492, 491, 488

(56) References Cited

U.S. PATENT DOCUMENTS

| | | | |
|---|---|---|---|
| 5,705,852 A | | 1/1998 | Orihara et al. |
| 5,795,852 A | | 8/1998 | Orihara et al. |
| 5,909,050 A | * | 6/1999 | Furey et al. ............. 152/152.1 |
| 5,982,628 A | | 11/1999 | Houdeau et al. |
| 6,255,725 B1 | * | 7/2001 | Akagawa et al. ............ 257/678 |
| 6,259,158 B1 | * | 7/2001 | Usami ........................ 257/679 |
| 6,319,827 B1 | * | 11/2001 | Kowalski et al. ........... 257/678 |

FOREIGN PATENT DOCUMENTS

| | | |
|---|---|---|
| EP | 0 737 935 A2 | 10/1996 |
| EP | 0 737 935 A3 | 12/1999 |
| WO | WO 96/07982 | 3/1996 |

* cited by examiner

*Primary Examiner*—Kamand Cuneo
*Assistant Examiner*—Jose' H. Alcala
(74) *Attorney, Agent, or Firm*—Paul & Paul

(57) ABSTRACT

A non-contact type IC card includes an insulating film having first and second surfaces. A plane coil is arranged on the first surface of the film. A semiconductor element is arranged on the first surface of the filmy The film has through holes which expose terminals of the plane coil and electrode terminals of the semiconductor element to the second surface of the film. A wiring pattern consisting of conductive paste is filled in the through holes and extends therebetween along the second surface of the film so that the terminals of the plane coil are electrically connected to the electrode terminals of the semiconductor element by means of the wiring pattern.

3 Claims, 6 Drawing Sheets

NON-CONTACT TYPE IC CARD AND PROCESS FOR MANUFACTURING SAME

BACKGROUND OF THE INVENTION

1. Field of the Invention

The present invention relates to a non-contact type IC card, comprising a plane coil and a semiconductor element, wherein terminal portions of the plane coil and electrode terminals of the semiconductor element are electrically connected to each other, and a process for manufacturing the IC card.

2. Description of the Related Art

A structure of a prior art non-contact type IC card will be described with reference to FIGS. 6(a) and 6(b).

The plane coil 52 is prepared by etching a metallic foil (for example, a copper foil) formed on one surface of a thin insulating resinous substrate, such as a resinous film, to have a generally rectangular coil shape or by printing a electro-conductive paste in a coil shape on line surface of the thin insulating resinous substrate 54 and drying the same. Opposite ends of the plane coil 52 define terminal portions 52a, respectively.

A semiconductor element 56 has two electrode terminals 58 projected from one surface thereof to be connected with the respective terminal portions 52a of the panel coil 52.

As shown in FIG. 7, the semiconductor element 56 is positioned and attached onto one surface of the thin insulating resinous substrate 54 so that two electrode terminals 58 of the semiconductor element 56 are extended over a part of the plane coil 52 and are located in alignment with the respective terminal portions 52a of the plane coil 52.

More concretely, as shown in FIG. 8, the semiconductor element 56 is press-fitted onto the thin insulating resinous substrate 54 via an anisotropic conductive film 60. Thereby, an electro-conductive path is formed between the projected electrode terminal 58 and the terminal portion 52a opposite thereto so that the electrode terminal 58 is electrically connected to the terminal portion 52a of the plane coil 52.

A pair of resinous over-sheets 62, each carrying an adhesive layer on one surface thereof, are placed, respectively, on both sides on the thin insulating resinous substrate 54 on which are disposed the plane coil 52 and the semiconductor element 56, and heated under pressure to form a non-contact type IC card 50, as shown in FIGS. 6(a) and 6(b).

Recently, as the semiconductor element 56 has become increasingly smaller in size, the gap between the pair of electrode terminals 58 formed on the semiconductor element 56 has also become smaller, whereby it is impossible to locate the semiconductor element 56 so that the electrode terminals 58 thereof are arranged inside and outside the plane coil 52.

As a countermeasure to this problem, it has been proposed that one of the terminal portions 52a of the plane coil 52 (for example, the inside terminal portion 52a) can be located at a position outside the plane coil 52 in the vicinity of the other terminal portion 52a, while the plane coil 52 is bridged via the opposite surface of the thin insulating resinous substrate 54 as shown in FIGS. 9 and 10.

According to this structure, even if the semiconductor element 56 only has a small gap between the electrode terminals 58, it is possible to locate the semiconductor element 56 at a position on the one surface of the thin insulating resinous substrate 54 without bridging over the plane coil 52, and to electrically connect the electrode terminals 58 to the terminal portions 52a of the plane coil 52 while using the same mounting structure as in the preceding example.

In this regard, the above-mentioned IC card relating to the prior art is disclosed in the U.S. Pat. No. 5,705,852 (issued on Jan. 6, 1998).

However, in the structure shown in FIGS. 9 and 10, it is necessary to adhere metallic foils onto both surfaces of the thin insulating resinous substrate 54, form the plane coil 52 as well as an extension wiring pattern 64 by etching the metallic foils and provide a through hole 66 to electrically connect the plane coil 52 formed on one surface with the extension wiring pattern 64 formed on the other surface. This results in an increase in production steps. Also, since it is necessary to use the thin insulating resinous substrate having the metallic foils adhered to the opposite surfaces thereof, there is a problem in that a material cost becomes higher to increase the product cost.

SUMMARY OF THE INVENTION

Thus, an object of the present invention is to provide a non-contact type IC card capable of mounting thereon a small-sized semiconductor element having a narrow gap between electrode terminals, without forming a circuit pattern on a surface of an thin insulating resinous substrate opposite to the surface on which a plane coil is formed.

Another object of the present invention is to provide a non-contact type IC card which solves the above-mentioned problems in the prior art.

According to the present invention, there is provided a non-contact type IC card comprising: an insulating film having first and second surfaces; a plane coil arranged on the first surface of the film, the plane coil having terminals; a semiconductor element arranged on the first surface of the film, the semiconductor element having electrode terminals; the film having through holes which expose the terminals of the plane coil and the electrode terminals of the semiconductor element to the second surface of the film; and a wiring pattern consisting of conductive paste, filled in the through holes and extending therebetween along the second surface of the film so that the terminals of the plane coil are electrically connected to the electrode terminals of the semiconductor element by means of the wiring pattern.

A gold-bump is provided on the electrode terminal of the semiconductor element and arranged within the through hole to facilitate an electrical connection between the conductive paste and the electrode terminal.

The terminal of the plane coil, exposed in the through, is plated with gold to facilitate an electrical connection between the conductive paste and the terminal of the plane coil.

According to another aspect of the present invention, there is provided a non-contact type IC card comprising: an insulating film having first and second surfaces; a plane coil arranged on the first surface of the film, the plane coil having terminals; a semiconductor element arranged on the second surface of the films the semiconductor element having electrode terminals; the film having through holes at positions where the electrode terminals of the semiconductor element are exposed by means of the through holes; and a wiring pattern consisting of conductive paste, filled in the through holes and extending therefrom to the terminals of the plane coil so that the terminals of the plane coil are electrically connected to the electrode terminals of the semiconductor element by means of the wiring pattern. In this connection, the plane coil where the wiring pattern is to cross the plane coil is covered with an insulator and the wiring pattern is formed on the insulator According to still another aspect of the present invention, there is provided a process for manufacturing a non-contact type IC card comprising the following steps of: forming a plane coil on a first surface of an insulating film; forming a film with through holes at positions where terminals of the plane coil and electrode terminals of a semiconductor element are to be exposed by the through holes to a second surface of the film; mounting the semiconductor element on the first surface of the film so that electrode terminals thereof are positioned in the through holes; and printing conductive paste so as to be filled in the through holes and extending therebetween along the second surface of the film to form a wiring pattern for electrically connecting the terminals of the plane coil to the electrode terminals of the semiconductor element.

According to further aspect of the present invention, there is provided a process for manufacturing a non-contact IC card comprising the following steps of: forming a plane coil on a first surface of an insulating film; forming a film with through holes at positions where electrode terminals of a semiconductor element are to be exposed by the through holes; mounting the semiconductor element on the second surface of the film so that electrode terminals thereof are positioned at the through holes; and printing conductive paste so as to be filled in the through holes and extending along the first surface of the film to form a wiring pattern for electrically connecting the terminals of the plane coil to the electrode terminals of the semiconductor element. In this connection, the plane coil is covered with an insulator where the wiring pattern will across the plane coil and, then, the conductive paste of the wiring pattern is pasted on the insulator.

The plane coil forming step can comprise preparing a substrate comprising the film to which a copper foil is previously adhered and then etching the copper foil. The plane coil forming step can also comprise printing conductor paste on the film.

A gold-bump is plated on the electrode terminal of the semiconductor element, before the semiconductor element is mounted on the first surface of the film.

The terminal of the plane coil is plated with gold, after the through hole is formed.

DETAILED DESCRIPTION OF THE EMBODIMENTS

Figure 1:
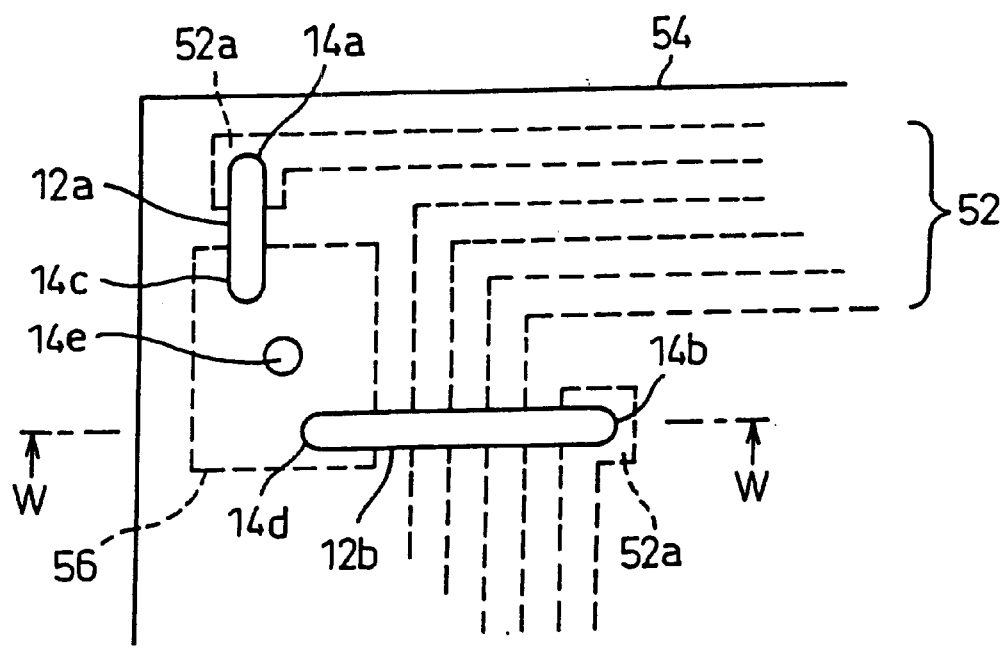
FIG. 1 is a plan view of a main part of a first embodiment of a non-contact type IC card according to the present invention.

A non-contact type IC card according to the present invention will be described below with reference to the preferred embodiments illustrated in the attached drawings. In this regard, the same reference numerals are used for designating the same or similar components and for illustrating the prior art and detailed descriptions thereof will not be given.

First Embodiment

A structure of a non-contact type IC card 10 will be described below.

First of all, among components of the non-contact type IC card, those the same as those in the prior art contact type IC card 50 will be described with reference to FIGS. 6(*a*) and 6(*b*).

A plane coil 52 is formed on a surface of a thin insulating resinous substrate or film 54, and a semiconductor element 56 is mounted on the surface of the thin insulating resinous substrate 54 so that electrode terminals 58 of the former are electrically connected to terminal portions of the plane coil 52, respectively, wherein the semiconductor element 56, the plane coil 52 and the thin insulating resinous substrate 54 are covered with a pair of oversheets 62 applied on the opposite sides of the thin insulating resinous substrate 54 to form an integral piece. A first adhesive layer 60 bonds the semiconductor element 56, electrode terminals 58 and plane coil 52. A second adhesive layer 61 bonds this assembly with the resinous substrate 54 and the pair of oversheets 62, as will be further discussed below.

Next, an electric. connection between the plane coil 52 and the semiconductor element 56 will be described, which is one of features of the non-contact type IC card 10 according to the present invention different from that of the prior art.

Figure 2:
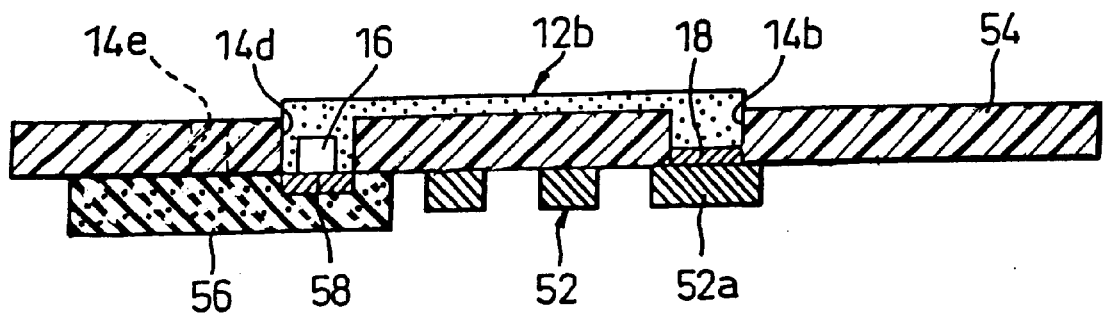
FIG. 2 is a sectional view taken along a line W—W in FIG. 1.

In this embodiment, as shown in FIGS. 1 and 2, the plane coil 52 and the semiconductor element 56 are arranged on the same surface of the thin insulating resinous substrate 54.

More specifically, the plane coil 52 is disposed on one surface of the thin insulating resinous substrate 54 (the lower surface as seen in FIGS. 1 and 2), and the semiconductor element 56 is also disposed on the one surface of the thin insulating resinous substrate 54.

The connecting structure between the terminal portions 52*a* of the plane coil 52 and the electrode terminals 58 of the semiconductor element 56 includes through-holes (14*a*, 14*b* and 14*c* and 14*d*) provided in the insulating thin resinous substrate 54 for exposing the terminal portion 52*a* of the plane coil 52 and the electrode terminal 58 of the semiconductor element 56 on the other surface of the thin insulating resinous substrate 54, and two connection circuit patterns 12*a*, 12*b*, formed of electro-conductive paste, extending between the terminal portion 52*a* of the plane coil 52 and the electrode terminal 58 of the semiconductor element 56, wherein opposite ends of the connection circuit patterns 12*a*, 12*b* are inserted into the through-holes 14*a* to 14*d* filled with the electro-conductive paste so that the respective terminal portions 52a of the plane coil 52 and the respective electrode terminals 58 are electrically connected to each other.

Thus, it is unnecessary to provide the extension wiring pattern 64 on the surface opposite to that carrying the plane coil 52, by etching the metallic foil in advance, whereby there is no need to use a thin insulating resinous substrate 54 having copper foils adhered to both sides thereof, which reduces the product cost.

To facilitate the electric connection with the electro-conductive paste filled in the through-holes 14c, 14d, the electrode terminal 58 of the semiconductor element 56 may be provided with a gold bump 16 protruded from the surface of the electrode terminal 58. Similarly, the terminal portion 52a of the plane coil 52 exposed from the through-hole 14a, 14b may be surface-treated by, for example, gold plating to form a gold-plated cover film 18. It should be noted that a gold-bump (not shown) can also be provided on the respective terminal portions of the plane coil 52.

Figure 5:
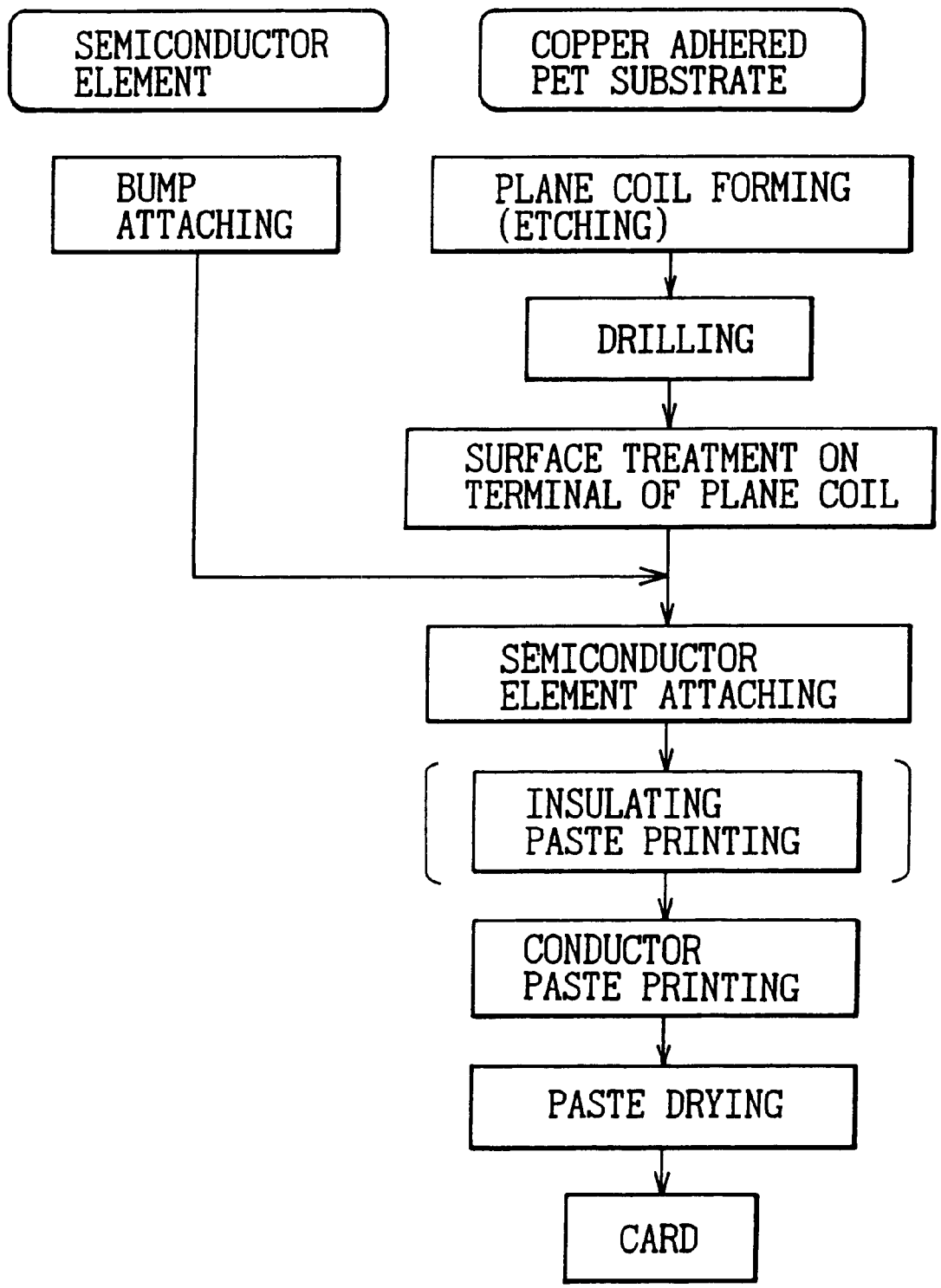
FIG. 5 is a block diagram for explaining a process for producing the IC card shown in FIG. 1.

Subsequently, a process for manufacturing the non-contact type IC card 10 will be described with reference to FIG. 5.

First, the gold bump 16 is formed on the surface of the electrode terminal 58 in the semiconductor element 56. The thin insulating resinous substrate, for example, a PET (poliyethylene terephthalate) substrate 54, is prepared, onto one surface of which is adhered a metallic foil such as a copper foil.

Next, the plane coil 52 is formed by etching the metallic foil on the thin insulating resinous substrate 54 (a process for forming a plane coil).

Then, the through-holes 14a to 14e are opened through the thin insulating resinous substrate 54 by, for example, using a laser beam (boring or drilling process). There are the first through-hole 14a and the second through-hole 14b for exposing the terminal portions 52a of the plane coil 52 out of the other surface of the thin insulating resinous substrate 54, and the third through-hole 14c and the fourth through-hole 14d for exposing the electrode terminals 58 out of the other surface of the thin insulating resinous substrate 54, as described herein before. It should be noted that the fifth through-hole 14e is also provided in an area in the one surface of the thin insulating resinous substrate 54 carrying the semiconductor element 56 thereon, for injecting a fixing resin.

Then, the gold-plated cover film 18 is formed on the surface of the terminal portions 52a of the plane coil 52 exposed out of the first through-hole 14a and the second through-hole 14b (a process for surface-treating the terminal portions of the plane coil).

Thereby, the adhesively of the electro-conductive paste to the terminal portions 52a is improved. Next, the semiconductor element 56 having the bumps 16 formed on the electrode terminals 58 thereof is fixedly secured on one surface of the thin insulating resinous substrate 54 so that the bumps 16 are positioned in the third and fourth through-holes 14c, 14d, respectively. The adhering operation is carried out by injecting an adhesive via the fifth through-hole 14e while maintaining the semiconductor element 56 in tight contact with the thin insulating resinous substrate 54.

Then, the electro-conductive paste (such as epoxy type resin containing silver filler) is coated in a region between the first and third through-holes 14a, 14c and a region between the second and fourth through-holes 14b, 14d on the other surface of the thin insulating resinous substrate 54, wherein a length of the respective region is preferably defined to be shortest (a process for printing the electro-conductive paste). In this process, the electro-conductive paste is filled in the respective through-holes 14a to 14d so that the electro-conductive paste is favorably brought into tight contact with the electrode terminals 58 and the terminal portions 52a. Thereby, the region between the first and third through-holes 14a, 14c and the region between the second and fourth through-holes 14b, 14d are covered with the electro-conductive paste.

Thereafter, the electro-conductive paste is dried to form the wiring pattern 14 (14a and 14b). Accordingly, the terminal portions 52a of the plane coil 52 and the electrode terminals 58 are electrically connected to each other (a process for drying the paste).

Figure 6A:
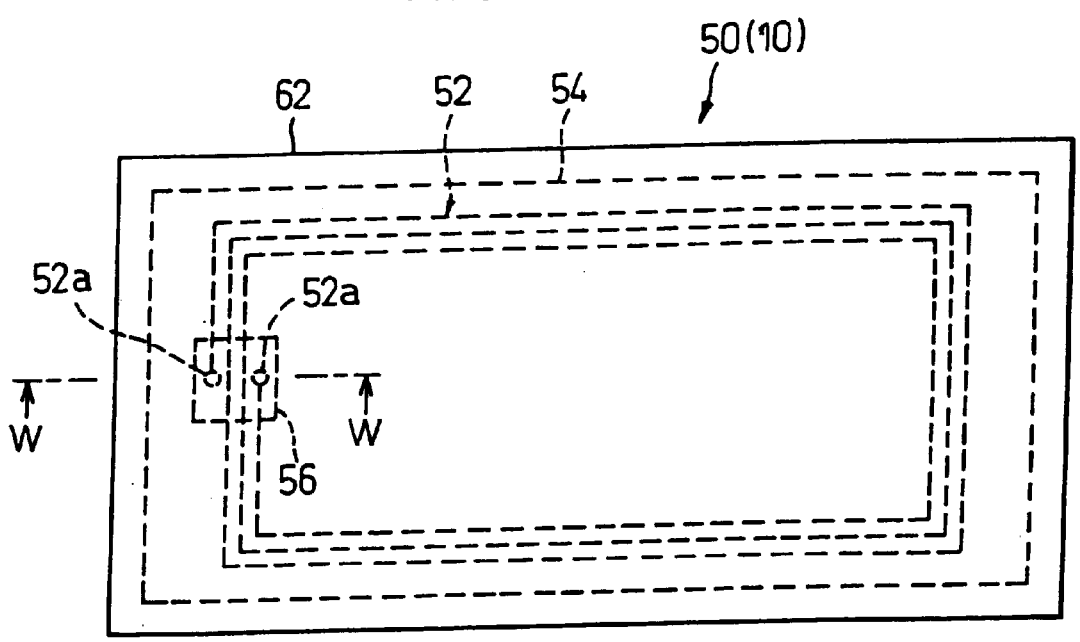
FIG. 6(a) is a plan view illustrating a non-contact type IC card.
Figure 6B:
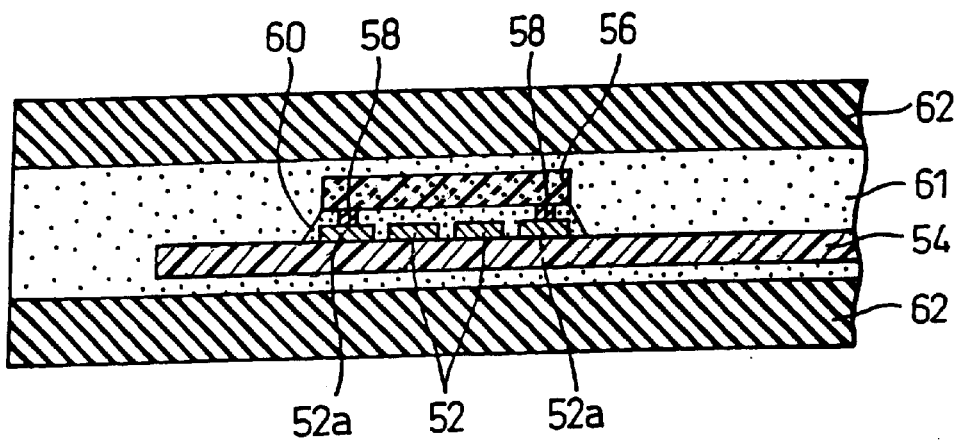
FIG. 6(b) is a sectional view thereof taken along a line W—W.
Figure 7:
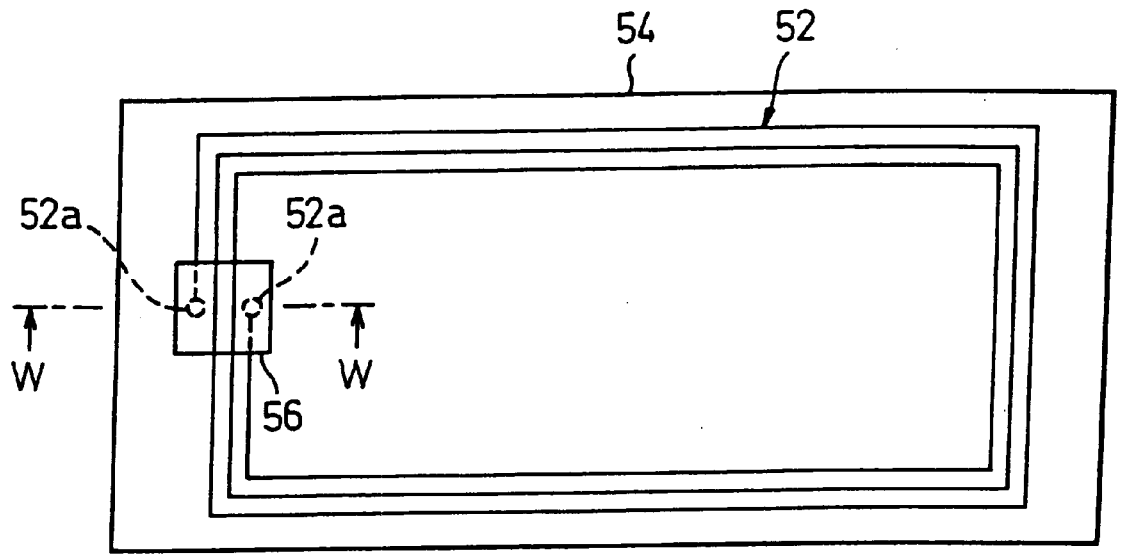
FIG. 7 is a plan view illustrating an example of a prior art non-contact type IC card.
Figure 8:
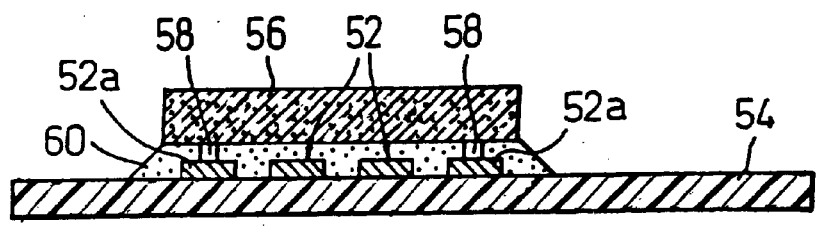
FIG. 8 is a sectional view taken along a line W—W in FIG. 7.
Figure 9:
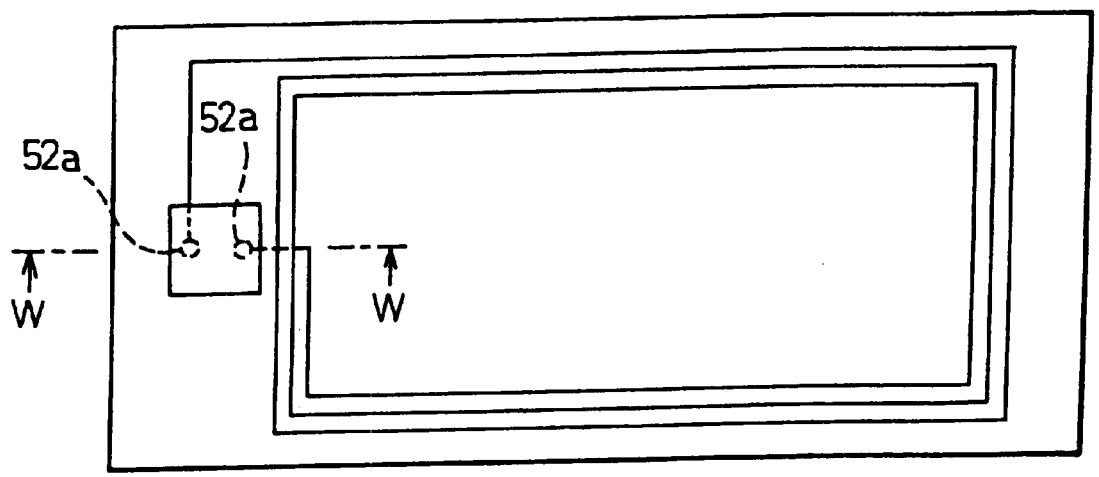
FIG. 9 is a plan view illustrating another example of a prior art non-contact type IC card.
Figure 10:
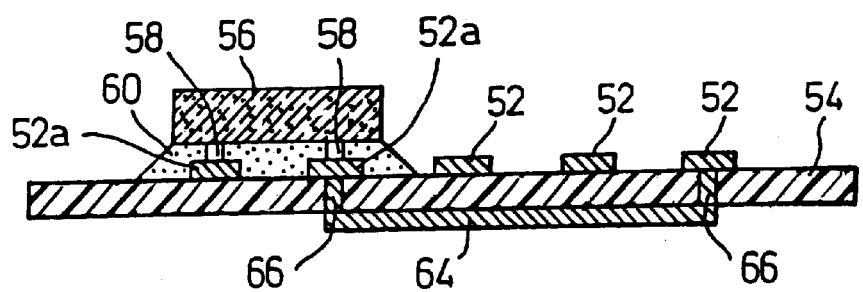
FIG. 10 is a cross-sectional view taken along a line W—W in FIG. 9.

Then, in a similar manner to that in the prior art, the resinous oversheets 62, each having the adhesive layer 61 on one surface thereof, are applied to both sides of the thin insulating resinous substrate 54 carrying the plane coil 52 and the semiconductor element 56 thereon so that the resinous oversheets are opposed to the thin insulating resinous substrate 54, and heated under pressure to form the non-contact type IC card 10 as shown in FIGS. 6(a) and 6(b) (a process for completing a card).

Second Embodiment

Figure 3:
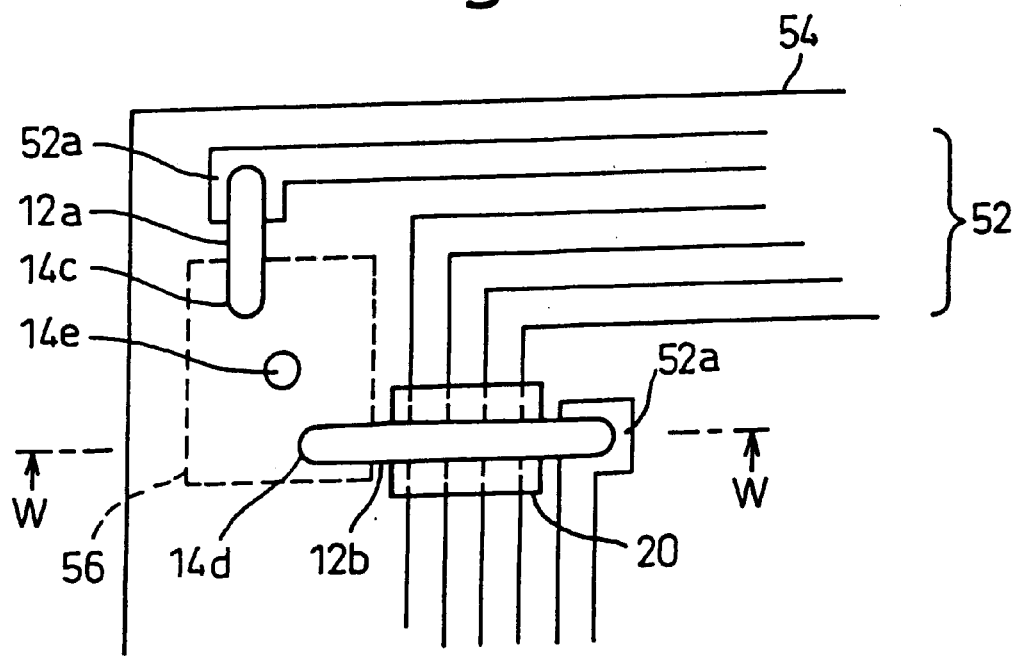
FIG. 3 is a plan view of a main part of a second embodiment of a non-contact type IC card according to the present invention.
Figure 4:
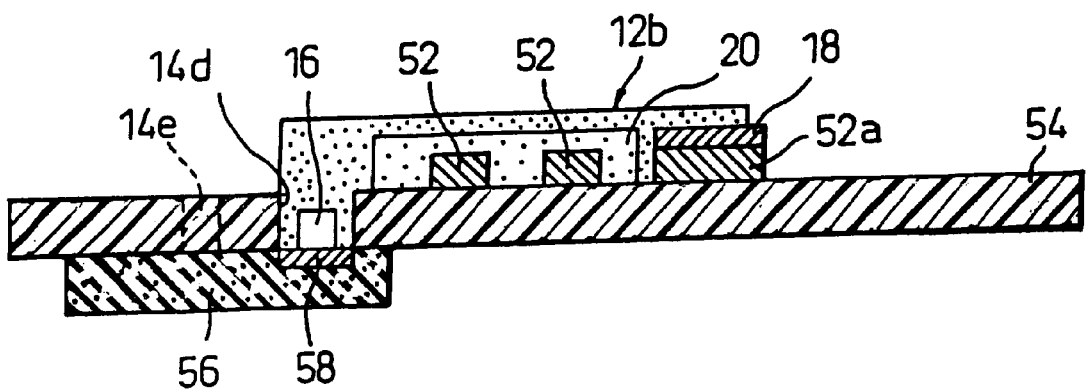
FIG. 4 is a sectional view taken along a line W—W in FIG. 3.

In a second embodiment, the plane coil 52 and the semiconductor element 56 are disposed on different surfaces, respectively, of a thin insulating resinous substrate or film 54 as shown in FIGS. 3 and 4.

More specifically, the plane coil 52 is disposed on one surface of the thin insulating resinous substrate 54 (the upper surface as seen in FIGS. 3 and 4), whilst the semiconductor element 56 is disposed on the other surface of the thin insulating resinous substrate 54 (the lower surface as seen in FIGS. 3 and 4).

The connecting structure between the terminal portions 52a of the plane coil 52 and the electrode terminals 58 of the semiconductor element 56 includes the third through-hole 14c and the fourth through-hole 14d provided in the insulating thin resinous substrate 54 for exposing the electrode terminal 58 of the semiconductor element 56 on the one surface, and two circuit patterns 12 (12a, 12b) formed of electro-conductive paste, extending between. the terminal portion 52a of the plane coil 52 and the electrode terminal 58 of the semiconductor element 56, wherein one end of each of the circuit patterns is finally inserted into the through-holes 14c and 14d whilst the other ends thereof are superposed with the terminal portions 52a of the plane coil 52 so that the respective terminal portions 52a of the plane coil 52 and the respective electrode terminals 58 are electrically connected to each other.

In this embodiment, since the circuit patterns 12 are formed on the same surface of the thin insulating resinous substrate 54 as that carrying the plane coil 52 thereon, one of the circuit patterns 12b necessarily crosses the plane coil 52.

Accordingly, it is necessary to electrically insulate the plane coil 52 from the circuit pattern 12b crossing the former to avoid a short circuit. For this purpose, as shown in FIGS. 3 and 4, an insulator 20 formed, for example, of insulating paste or an insulating resinous sheet is interposed between this circuit pattern 12b and the plane coil 52 by forming the circuit pattern 12b on the insulator 20.

Also in the non-contact type IC card of the above-mentioned embodiment, it is unnecessary to provide the circuit pattern on one surface of the thin insulating resinous substrate 54 opposite to that carrying the plane coil 52 thereon by, for example, etching the metallic foil adhered to the one surface in advance, which means that there is no need to use the thin insulating resinous substrate 54 having the copper foils adhered on both surfaces resulting in a reduction in the product cost.

A process for producing the non-contact type IC card 10 of this second embodiment will be described below. In this regard, since a basic flow of the production process is substantially the same as that in the first embodiment, an explanation will be given solely regarding the difference between the embodiments, with reference to FIG. 5.

A process for forming the plane coil in this second embodiment is the same as that in the first embodiment.

In a boring process, there are solely provided the third through-hole 14c and the fourth through-hole 14d for exposing the electrode terminals 58 of the A structure of a non-contact type IC card 10 will be described below.

First of all, among components of the non-contact type IC card, those the same as those in the prior art contact type IC card 50 will be described with reference to FIGS. 6(a) and 6(b).

A lane coil 52 is formed on a surface of an thin insulating resinous substrate or film 54, and a semiconductor element 56 is mounted on the surface of the thin insulating resinous substrate 54 so that electrode terminal's 58 of the former are electrically connected to terminal portions of the plane coil 52, respectively, wherein the semiconductor element 56, the plane coil 51 and the thin insulating resinous substrate 54 are covered with a pair of oversheets 62 applied on the opposite sides of the thin insulating resinous substrate 54 to form an integral piece.

Next, an electric connection between the plane coil 52 and the semiconductor element 56 will be described, which is :one of features of the non-contact type IC card 10 according to the present invention different from that of the prior art.

In this embodiment, as shown in FIGS. 1 and 2, the plane coil 52 and the semiconductor element 56 are arranged on the same surface of the thin insulating resinous substrate 54.

More: specifically, the plane coil 52 is disposed on one surface of the thin insulating resinous substrate 54 (the lower surface as seen in FIGS. 1 and 2), and the semiconductor element 56 is also disposed on the one surface of the thin insulating resinous substrate 54.

The connecting structure between the terminal portions 52a of the plane coil 52 and the electrode terminals 58 of the semiconductor element 56 includes through-holes (14a, 14b and 14c and 14d) provided in the insulating thin resinous substrate 54 for exposing the terminal portion 52a of the plane coil 52 and the semiconductor element 56 and the fifth through-hole 14e for fixing the semiconductor element 56.

In a process for surface-treating the terminal portions of the plane coil, the gold-plated cover film 18 is formed all over the surface of the terminal portion 52a of the plane coil 52.

In a process for adhering the semiconductor element, the semiconductor element 56 with the electrode terminals 58 having the bumps 16 formed thereon is adhered to the other surface of the thin insulating resinous substrate 54 so that the bumps 16 are positioned in the third through-hole 14c and the fourth through-hole 14d.

After the process for adhering the semiconductor element 56 and before the process for printing electro-conductive paste 12a, 12b, the insulator 20 must be provided too cover the plane coil 52 at a position in which the circuit pattern 12b is to cross the plane coil 52. As an example, the insulator 20 may be formed by coating and drying an insulating paste (a process for printing the insulating paste). Note the insulator 20 can also be provided by adhering an insulating sheet onto the plane coil 52.

The other steps from the process for printing electro-conductive paste to the process for completing the IC card are the same as those in the first embodiment. In this regard, in the process for printing electro-conductive paste, the electro-conductive paste of the circuit pattern 12b extends between the fourth through-hole 14d and the terminal portion 52a of the plane coil 52 via the surface of the insulator 20.

In the first and second embodiments described above, the plane coil 52 can also be formed by printing the electro conductive paste and drying the same.

In such a case, since the circuit patterns 12a, 12b for electrically connecting the plane coil 52 with the semiconductor element 56 are also formed of electro-conductive paste, it is possible to assuredly achieve the electrical connection even if the surface treatment (gold-plating treatment) of the terminal portion 52a of the plane coil 52 to be in contact with the circuit patterns 12a, 12b is eliminated.

Although the semiconductor element 56 is located in an area outside the plane coil 52 not overlapped therewith in the above embodiments, it can also be located in an area inside the plan coil 52 so that a profile o the non-contact type IC card 10 is minimized.

In thee above embodiments, the plane coil 52 is formed on the substrate 54. However, it is also possible that a coil is prepared by punching or etching from a thin metallic sheet and it is then adhered to a thin insulating resinous substrate 54.

According to the non-contact type IC card of the present invention, it is possible to mount a semiconductor element, of such a small size that the gap between electrode terminals is extremely narrow, onto the thin insulating resinous substrate even though there is no circuit pattern on a surface of the latter opposite to that carrying a plane coil thereon. Therefore, there is no need to use a thin insulating resinous substrate having copper foils adhered on both surfaces thereof, which reduces the production cost and the product cost.

It should be understood by those skilled in the art that the foregoing description relates to only some of the preferred embodiments of the disclosed invention, and that various changes and modifications may be made to the invention without departing from the spirit and scope thereof.

It should be noted that, although the terminal portion 52a of the plane coil 52 are plated with gold in the first and second embodiments, a gold bump can be formed on the respective terminal portions 52a.

What is claimed is:

1. A non-contact type IC card comprising:

an insulating film having first and second surfaces;

a plane coil arranged on said first surface of the film, said plane coil having terminals;

a semiconductor element arranged on said first surface of the film, said semiconductor element having electrode terminals;

said film having through holes which expose said terminals of the plane coil and said electrode terminals of the semiconductor element to said second surface of the film; and a wiring pattern consisting of conductive paste, filled in said through holes and extending therebetween along said second surface of the film so that said terminals of the plane coil are electrically connected to said electrode terminals of the semiconductor element by means of said wiring pattern.

2. A non-contact type IC card as set forth in claim 1, wherein a gold-bump is provided on each of said electrode terminals of the semiconductor element and arranged within said through hole to facilitate an electrical connection between said conductive paste and each of said electrode terminals.

3. A non-contact type IC card as set forth in claim 1, wherein each of said terminals of the plane coil, exposed in said through hole, is plated with gold to facilitate an electrical connection between said conductive past and each of said terminals of the plane coil.

* * * * *